United States Patent
Matsuda et al.

(10) Patent No.: US 10,777,066 B2
(45) Date of Patent: Sep. 15, 2020

(54) ALARM-FUNCTION SETTING APPARATUS, ALARM-FUNCTION SETTING SYSTEM AND ALARM-FUNCTION SETTING PROGRAM

(71) Applicant: Mitsubishi Electric Corporation, Tokyo (JP)

(72) Inventors: Akiko Matsuda, Aichi (JP); Atsushi Harata, Aichi (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/327,331

(22) PCT Filed: Feb. 5, 2018

(86) PCT No.: PCT/JP2018/003873
§ 371 (c)(1),
(2) Date: Feb. 22, 2019

(87) PCT Pub. No.: WO2019/150584
PCT Pub. Date: Aug. 8, 2019

(65) Prior Publication Data
US 2019/0378342 A1    Dec. 12, 2019

(51) Int. Cl.
*G08B 21/18* (2006.01)
*G06F 30/17* (2020.01)

(52) U.S. Cl.
CPC .......... *G08B 21/187* (2013.01); *G06F 30/17* (2020.01); *G06T 2219/004* (2013.01)

(58) Field of Classification Search
CPC .................................................. G08B 21/187
See application file for complete search history.

(56) References Cited

U.S. PATENT DOCUMENTS

2008/0238916 A1* 10/2008 Ghosh ................. G06F 3/04815
345/419
2009/0005928 A1* 1/2009 Sells .................. G06Q 30/0641
701/31.7
(Continued)

FOREIGN PATENT DOCUMENTS

CN          107077124 A      8/2017
DE    10 2016 011 494 A1    3/2017
(Continued)

OTHER PUBLICATIONS

Decision to Grant received for Japanese Patent Application No. 2018-536309, dated Sep. 11, 2018, 4 pages including English Translation.
(Continued)

*Primary Examiner* — Phi Hoang
(74) *Attorney, Agent, or Firm* — Xsensus LLP

(57) ABSTRACT

An alarm-function setting apparatus includes an acquisition circuitry that captures CAD data of an external apparatus in which occurrence of abnormality is monitored and acquires, from the CAD data, list information which is information about a part of the external apparatus. The apparatus further includes setting circuitry that sets information in the list information, in an alarm function being a function of, when an abnormality occurs in the external apparatus, conveying informing about an abnormality-occurring position, the alarm function being used by a display that displays a status of the external apparatus.

20 Claims, 13 Drawing Sheets

(56) References Cited

U.S. PATENT DOCUMENTS

| | | | |
|---|---|---|---|
| 2015/0324114 A1* | 11/2015 | Hurley | G16H 50/20 |
| | | | 715/850 |
| 2017/0090436 A1 | 3/2017 | Ando | |
| 2018/0033076 A1* | 2/2018 | Roundtree | G06K 3/00 |
| 2018/0315238 A1* | 11/2018 | Le Doux | G06T 11/60 |

FOREIGN PATENT DOCUMENTS

| | | |
|---|---|---|
| JP | 6-243372 | 9/1994 |
| JP | 08-161031 A | 6/1996 |
| JP | 10-097552 A | 4/1998 |
| JP | 11-327616 A | 11/1999 |
| JP | 2003-216236 A | 7/2003 |
| JP | 2003-295915 A | 10/2003 |
| JP | 2011-014658 A | 1/2011 |
| JP | 2017-068324 A | 4/2017 |

OTHER PUBLICATIONS

International Search Report dated Apr. 10, 2018 for PCT/JP2018/003873 filed on Feb. 5, 2018, 1 page (Official Copy).
Korean Notification of Reason for Refusal issued in Korean Application No. 10-2019-7009524 dated Oct. 11, 2019.
German Office Action dated Jan. 28, 2020, issued in corresponding German Patent Application No. 11 2018 000 124.5.
Taiwanese Office Action dated Mar. 30, 2020 in Taiwanese patent application No. 198102731.
Office Action dated May 13, 2020 in Chinese Patent Application No. 201880003811.3, 29 pages.

* cited by examiner

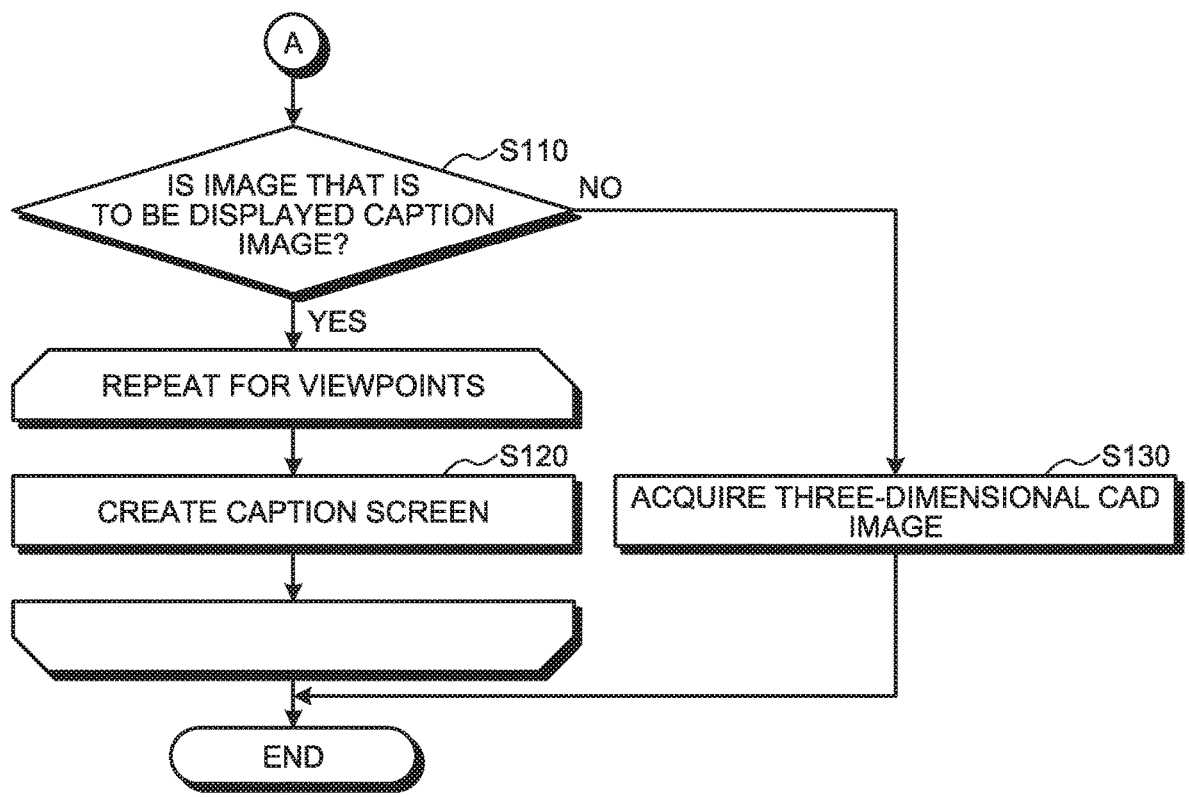
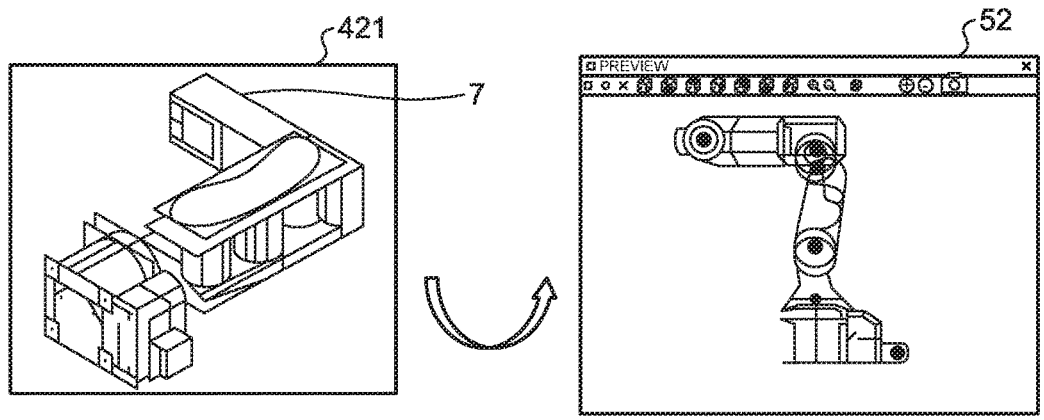

| No | PART NAME | DEVICE | ALARM CONDITION | DISPLAY TARGET | WAY TO DISPLAY ERROR | COMMENT | COORDINATES | | |
|---|---|---|---|---|---|---|---|---|---|
| 1 | SHAFT 1 | D0 | $V == 0 | SHAFT 1 | INVERTING COLOR | [NAME] ABNORMALITY HAS OCCURRED | | | |
| 2 | ARM 1 | D1 | $V == 1 | ARM 1 | INVERTING COLOR | [NAME] NEED CHECKING | | | |
| 3 | SHAFT 2 | | | SHAFT 2 | INVERTING COLOR | | | | |
| 4 | SHAFT 3 | | | SHAFT 3 | INVERTING COLOR | | | | |
| 5 | ARM 2 | | | ARM 2 | INVERTING COLOR | | | | |
| 6 | SHAFT 4 | | | SHAFT 4 | INVERTING COLOR | | | | |
| 7 | ARM 3 | | | ARM 3 | INVERTING COLOR | | | | |
| 8 | SHAFT 5 | | | SHAFT 5 | INVERTING COLOR | | | | |
| 9 | BASE 1 | | | BASE 1 | INVERTING COLOR | | | | |
| 10 | POINT_1 | | | CIRCLE | BLINKING | | X 55 | Y 25 | Z 64 |
| 11 | | | | | | | X | Y | Z |

FIG.9

| LABEL-FUNCTION INFORMATION | 201 |
|---|---|
| LABEL NAME | DEVICE |
| SHAFT 1 | D0 |
| ARM 1 | D1 |
| ⋮ | ⋮ |

FIG.10

| COMMENT-FUNCTION INFORMATION | 202 |
|---|---|
| COMMENT IDENTIFICATION INFORMATION | COMMENT |
| 001 | ABNORMALITY HAS OCCURRED |
| 002 | NEED CHECKING |
| ⋮ | ⋮ |

FIG.11

| ALARM-FUNCTION INFORMATION ,203 |||
|---|---|---|
| DEVICE | ALARM CONDITION | COMMENT IDENTIFICATION INFORMATION |
| D0 | $V==0 | 001 |
| ⋮ | ⋮ | ⋮ |

ALARM-FUNCTION SETTING APPARATUS, ALARM-FUNCTION SETTING SYSTEM AND ALARM-FUNCTION SETTING PROGRAM

CROSS-REFERENCE TO RELATED APPLICATIONS

The present application is based on PCT filing PCT/JP2018/003873, filed Feb. 5, 2018, the contents of which are incorporated herein by reference.

FIELD

The present invention relates to an alarm-function setting apparatus, an alarm-function setting system, and an alarm-function setting program, all of which support setting an alarm function in a display.

BACKGROUND

Some display devices displays the status of external apparatuses connected to programmable logic controllers (PLC). When an abnormality occurs in an external apparatus, such a display device has an alarm function of visually expressing an abnormality-occurring position on the external apparatus. An alarm-function setting apparatus, which provides various settings for the alarm function, creates, in accordance with an instruction from an operator, alarm-function information that is information set in the alarm function. The alarm-function information created by the alarm-function setting apparatus is transmitted from the alarm-function setting apparatus to the display device and used when the display device performs the alarm function.

CITATION LIST

Patent Literature

Patent Literature 1: Japanese Patent Application Laid-open. No. H10-097552

SUMMARY

Technical Problem

In order to set such an alarm function, an operator who sets the alarm function should hitherto perform many display settings for each abnormality-occurring position; thus, it takes a long time to set the alarm function.

The Computer-Aided Design (CAD) data conversion apparatus described an Patent Literature 1 extracts specific data from CAD data, converts the format of the extracted data, and transfers the format-converted data to a maintenance tool in order to achieve an efficient operation of inputting data to the maintenance tool for maintenance work.

Unfortunately, patent Literature 1, which merely teaches that the format of specific data included in CAD data is converted and transferred to the maintenance tool, poses a problem of taking time and labor to set, in the alarm function, information about an external apparatus in which occurrence of abnormality is monitored.

The present invention has been made in view of the above problems and is to provide an alarm-function setting apparatus capable of setting part information about an external apparatus in an alarm function of a display device that displays the status of the external apparatus in which occurrence of abnormality is monitored.

Solution to Problem

To solve the above problem and achieve the object, the present invention provides an alarm-function setting apparatus comprising: an acquisition unit to capture three-dimensional computer-aided design data on an external apparatus in which occurrence of abnormality is monitored, and acquire part information from the three-dimensional computer-aided design data, the part information being information about a part of the external apparatus; and a setting unit to set the part information in an alarm function, the alarm function being a function of, when an abnormality occurs in the external apparatus, conveying information relating to a part at which the abnormality has occurred, the alarm function being used by a display device that displays a status of the external apparatus.

Advantageous Effects of Invention

An alarm-function setting apparatus according to the present invention has an effect that part information about an external apparatus in which occurrence of abnormality is monitored is easily set in an alarm function of a display device.

BRIEF DESCRIPTION OF DRAWINGS

FIG. 3 is a flowchart illustrating a processing procedure of a second half of the stages of the information acquisition processing according to the embodiment.

FIG. 4 is a diagram illustrating examples of CAD data and a preview screen according to the embodiment.

FIG. 6 is a diagram illustrating an example of list information according to the embodiment.

FIG. 9 is a diagram illustrating a configuration example of label-function information according to the embodiment.

FIG. 10 is a diagram illustrating a configuration example of comment-function information according to the embodiment.

FIG. 11 is a diagram illustrating a configuration example of alarm-function information according to the embodiment.

DESCRIPTION OF EMBODIMENT

Hereinafter, an alarm-function setting apparatus, an alarm-function setting system, and an alarm-function setting program according to an embodiment of the present invention are described in detail with reference to the drawings. Note that, the invention is not limited by the embodiment.

Embodiment

Figure 1:
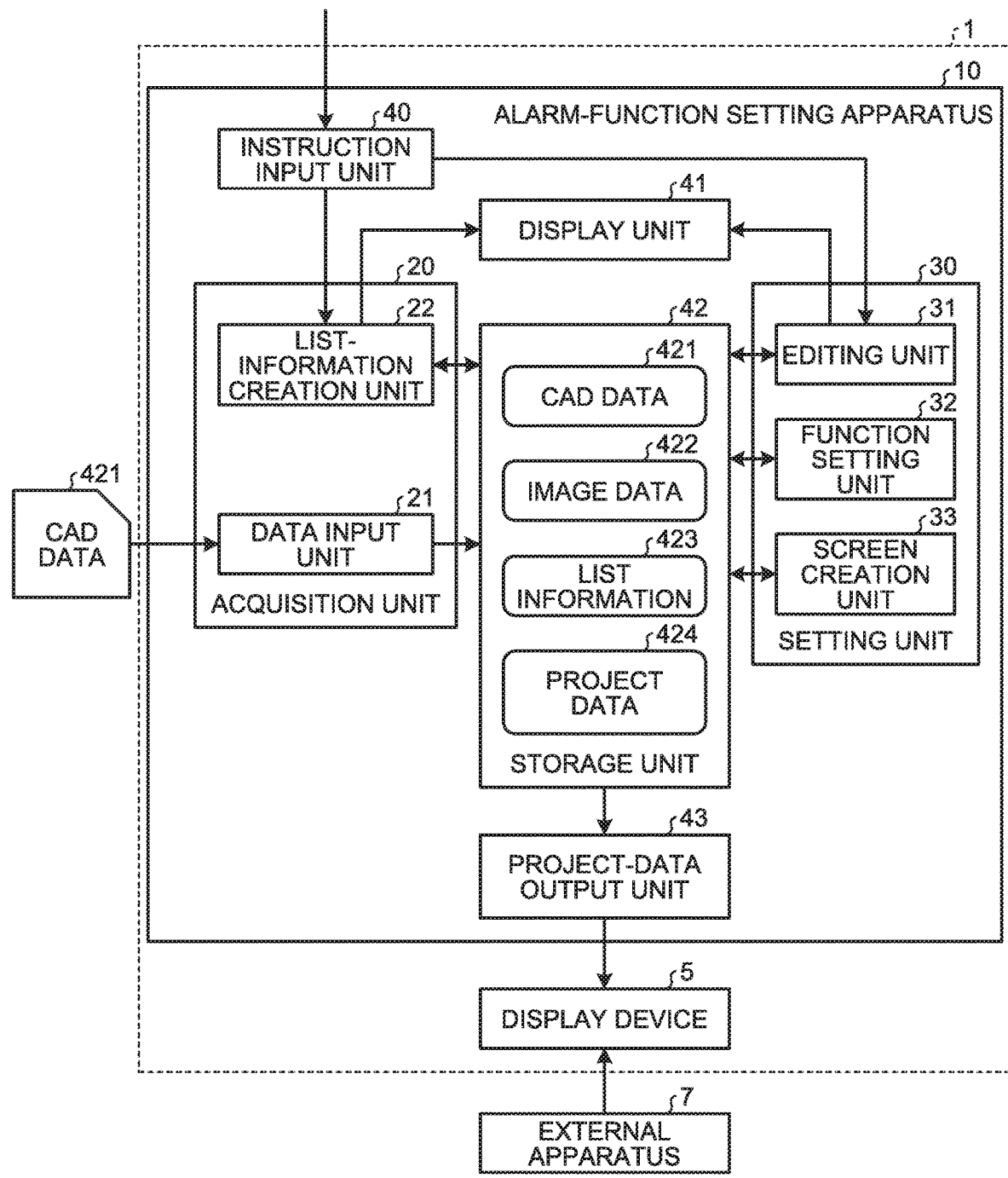
FIG. 1 is a diagram illustrating a configuration of an alarm-function setting apparatus according to an embodiment of the present invention.

FIG. 1 is a diagram illustrating a configuration of an alarm-function setting apparatus according to an embodiment of the present invention. An alarm-function setting system 1 includes an alarm-function setting apparatus 10 and a display device 5. The alarm-function setting apparatus 10 supports setting of an alarm function used by the display device 5. In other words, the alarm-function setting apparatus 10 supports creation of alarm-function information. The alarm-function information is information set for the display device 5 to implement the alarm function. Thus, the alarm-function setting apparatus 10 sets the alarm function, which corresponds to an operation of the alarm-function setting apparatus 10 creating the alarm-function information.

The alarm-function setting apparatus 10 according to the present embodiment includes, as described in detail below, an acquisition unit 20 and a setting unit 30. The acquisition unit 20 captures CAD data 421 on an external apparatus 7 in which occurrence of abnormality is monitored. The CAD data 421 is captured for each part of an external apparatus 7. The acquisition unit 20 acquires, from the captured CAD data 421, list information 423 which is information about each part of the external apparatus 7. The setting unit 30 sets the information in the list information 423, in an alarm function. The alarm function is a function used by the display device 5 for displaying the status of the external apparatus 7. When an abnormality occurs in the external apparatus 7, the alarm function conveys information about an abnormality-occurring position. Thus, the alarm-function setting apparatus 10 easily sets, in the alarm function of the display device 5, part information about the part of the external apparatus 7 in which occurrence of abnormality is monitored. Note that, the acquisition unit 20 may capture the CAD data 421 by any unit other than each part of the external apparatus 7.

The alarm-function information is set in the alarm function of the display device 5 and is used when an alarm display program which is the alarm function is executed by the display device 5. The alarm-function setting apparatus 10 performs setting processing based on the operation by an operator and automatic setting processing. The alarm-function setting apparatus 10 transmits the created alarm-function information to the display device 5.

The display device 5 is connected to the external apparatus 7 such as a sensor, a driving apparatus, a robot, or a signal input/output device. The external apparatus 7 is controlled by a control apparatus such as a PLC (not illustrated). The display device 5 displays the status of an apparatus in which occurrence of abnormality is monitored. The apparatus in which occurrence of abnormality is monitored is the external apparatus 7 connected to the display device 5. The display device 5 includes a unit such as a touch panel that is to be operated by an operator and displays information according to the operation on the touch panel.

The display device 5 performs the alarm function when an abnormality, such as an error, occurs in the external apparatus 7.

The alarm function is the function of assisting troubleshooting when an abnormality occurs in the external apparatus 7. When an abnormality occurs in the external apparatus 7, the display device 5 uses the alarm function to thereby visually express the information set in the alarm-function information. At this time, the display device 5 displays, using the alarm function, later-described information relating to a part of the external apparatus 7 at which part the abnormality has occurred. The alarm function is implemented by an alarm display program for displaying occurrence of abnormality. The alarm display program is the program that displays occurrence of abnormality, using the alarm-function information. Thus, processing for creating the alarm-function information is processing for creating information that the alarm display program uses in displaying occurrence of abnormality. When making a notification of occurrence of abnormality, the display device 5 may perform alarm output, such as a sound output indicating occurrence of abnormality or a light output from a warning lamp indicating occurrence of abnormality, in addition to displaying the occurrence of abnormality.

When an alarm that indicates occurrence of abnormality is selected by the operator, the display device 5 displays an image which is a visual image of the external apparatus 7, using the alarm function. The displayed image corresponds to the selected alarm. The image of the external apparatus 7 is, for example, a captured image which is an image diagram of the external apparatus 7 and three-dimensional CAD image data to be described later.

The alarm-function setting apparatus 10 extracts information about the external apparatus 7 from the CAD data 421, which is three-dimensional computer-aided design data, sets the extracted information in the alarm function. In other words, the alarm-function setting apparatus 10 extracts information about the external apparatus 7 from the CAD data 421 and, using this extracted information, creates the alarm-function information. The CAD data 421 indicating the configuration of the external apparatus 7 includes, as the information relating to the external apparatus 7, the part information about each part of the external apparatus 7. The part information includes a part name and part coordinates. The part name is the name of the part. The part coordinates indicate the position of the part. The CAD data 421 as created for each part of the external apparatus 7.

When the operator inputs information to the alarm-function setting apparatus 10, the alarm-function setting apparatus 10 receives and sets the input information in the alarm function. The information set in the alarm function includes, for example, a message indicating an abnormality of the external apparatus 7, a comment relating to the abnormality, and a display target highlighted when the abnormality occurs. The display target is a part or a point indicating an abnormality-occurring position. A part indicates a specific region of the external apparatus 7, and a point indicates a specific position of the external apparatus 7. As such, a part is used to indicate an abnormality-occurring position as a region, and a point is used to indicate an abnormality-occurring position as a dot. A part is, for example, an image illustrating the part. A point is, for example, an image of a lamp indicating the position at which an abnormality occurs.

The alarm-function setting apparatus 10 includes the acquisition unit 20, a storage unit 42, and the setting unit 30. The acquisition unit 20 acquires information transmitted from the outside. The storage unit 42 stores various types of information. The setting unit 30 provides the alarm function with various settings, using the information in the storage unit 42. The alarm function setting apparatus 10 further includes a display unit 41, an instruction input unit 40, and a project-data output unit 43. The display unit 41 displays various types of information. The instruction input unit 40 receives an instruction from the operator. The project-data output unit 43 outputs project data 424 created by the setting unit 30, to the display device 5. The project data 424 includes: data on screen images displayed by the display device 5; alarm-function information; comment-function information; and label-function information. The alarm-function information is information set in the alarm function. The comment-function information is information set in a comment function as will be described later. The label-function information is information set in a label function as will be described later.

The instruction input unit 40 receives an instruction from the operator and inputs the received instruction to the acquisition unit 20 or the setting unit 30. When receiving from the operator a position of viewpoint of a caption image, the instruction input unit 40 inputs the received position of viewpoint to the acquisition unit 20. When receiving from the operator a point that is to be displayed at the time of abnormality of the external apparatus 7, the instruction input unit 40 inputs the received point to the acquisition unit 20.

When receiving from the operator an instruction to display a preview screen or an instruction to create the list information 423, the instruction input unit 40 inputs the received display instruction or creation instruction to the acquisition unit 20. When receiving from the operator an instruction to edit the list information 423, the instruction input unit 40 inputs the received editing instruction to the setting unit 30.

The acquisition unit 20 includes a list-information creation unit 22 that creates the list information 423. The acquisition unit 20 further includes a data input unit 21 that receives the CAD data 421 from the outside and inputs the received CAD data 421 to the storage unit 42. The data input unit 21 captures the CAD data 421 for each part of the external apparatus 7 and inputs the captured CAD data 421 into the storage unit 42.

The list-information creation unit 22 creates the list information 423 on the basis of information transmitted from the instruction input unit 40 and the CAD data 421. The information transmitted from the instruction input unit 40 to the list-information creation unit 22 is instruction information corresponding to the operation by the operator.

The list information 423 includes information that is to be set in the alarm function, the comment function, and the label function. In other words, the list information 423 includes information used to create the alarm-function information, the comment-function information, and the label-function information. In the list information 423, a part name, a display target, a comment, and the coordinates indicating a position of the display target on the screen that is to be displayed on the display device 5 are associated with one another.

The list-information creation unit 22 extracts the part information from the CAD data 421 and registers the extracted part information in the list information 423. The list-information creation unit. 22 further registers, in the list information 423, point information set by the operator. The point information, which is information about a point set in the external apparatus 7, includes the point coordinates indicating the position of the point. The part information and the point information, which are registered in the list information 423, are set in the alarm function and the like.

The part information includes a part name, and the list-information creation unit 22 registers in the list information 423 the part name which is one piece of information of the part information. The part name is information set in the label function. The label function is the function of assigning an easily understandable arbitrary name such as a part name to a device as will be described later. In the label-function information, a correspondence relation between a label name and a device is registered. A name other than a part name may be registered as a label name in the label-function information. The label function provides the alarm function with the label name corresponding to a device in which an abnormality has occurred when an alarm is displayed. In the present embodiment, a part name is registered as the label name in the label-function information, and the label function provides the alarm function with the part name when an alarm is displayed.

In this manner, the label function provides the alarm function with the part name corresponding to a display target. The label function is implemented by a label specifying program for specifying a part name displayed using the alarm function. The label specifying program is the program for specifying a label name, using the label-function information. Thus, processing for creating the label-function information is processing for creating information that the label specifying program uses in specifying a label name. The part name corresponding to a device is registered as a label name of the label-function information. Among part names set in the label function, the part name of a display target part is a first name, and the part name of a display target point is a second name.

The alarm function highlights display target together with the part name corresponding to a device in which an abnormality has occurred when an alarm is displayed. The highlighted display target, which is a position that is to be highlighted when an abnormality occurs, is a part or a point. In other words, the display targets includes a display target part that is a part which the display device 5 displays using the alarm function. When an abnormality occurs in the eternal apparatus 7, the part indicates the abnormality-occurring position. The display targets also include a display target point that is a point which the display device 5 displays using the alarm function. When an abnormality occurs in the external apparatus 7, the point indicates the abnormality-occurring position.

On the basis of the operation by the operator, the list-information creation unit 22 registers, in the list information 423, a comment that is to be set in the comment function. The comment function is the function of providing the alarm function with a comment that is to be displayed when an alarm is displayed. The comment function is implemented by a comment specifying program. Far specifying a comment that is to be displayed using the alarm function. The comment specifying program is the program for specifying a comment, using the comment-function information. Thus, processing for creating the comment-function information is processing for creating information that the comment specifying program uses in specifying a comment. In the comment function, a correspondence relation between a list of comments and comment identification information, which is identification information about comments, is registered.

On the basis of the operation by the operator, the list-information creation unit 22 creates image data 422 from the CAD data 421 indicating the configuration of the external apparatus 7. The image data 422 is a caption image or three-dimensional CAD image data. A caption image is an image of the external apparatus 7 as viewed from a specific direction. Three-dimensional CAD image data is data capable of displaying the external apparatus 7 in the form of images viewed from various viewpoints, in accordance with the operation by the operator.

When the operator designates a position of viewpoint of a caption image, the list-information creation unit 22 uses the CAD data 421 to thereby create the caption image viewed from the designated position of viewpoint. When instructed by the operator to create three-dimensional CAD image data, the list-information creation unit 22 uses the CAD data 421 to thereby create the three-dimensional CAD image data.

The list-information creation unit 22 stores the created list information 423 in the storage unit 42. The list-information creation unit 22 further stores the created caption image or three-dimensional CAD image data, as the image data 422, in the storage unit 42.

The list-information creation unit 22 displays the list information 423 on the display unit 41. The list-information creation unit 22 further displays the caption image or the three-dimensional CAD image data on the display unit 41.

The setting unit 30 includes an editing unit 31, a function setting unit 32, and a screen creation unit 33. The editing unit 31 edits the list information 423. The function setting unit 32 provides the alarm function and the like with various settings, using the list information 423. The screen creation unit 33 creates data on screens that are to be displayed when an abnormality occurs.

The editing unit 31 edits the list information 423 in accordance with an editing instruction from the operator. The editing unit 31 overwrites the pre-editing list information 423 in the storage unit 42, with the edited list information 423. The editing unit 31 displays the list information 423 on the display unit 41.

As described above, the list-information creation unit 22 sets a part name. The setting of a part name may be changed by the editing unit 31 in accordance with an editing instruction from the operator. Thus, the operator can associate the information registered in the list information. 423 with an arbitrary part name.

On the basis of the list information 423, the function setting unit 32 provides various settings for the alarm function, the comment function, and the label function. In other words, the function setting unit 32 creates the alarm-function information, the comment-function information, and the label-function information on the basis of the list information 423.

The function setting unit 32 sets, in the alarm function, an alarm condition which is a condition for outputting an alarm. The function setting unit 32 sets, in the comment function, a comment that is to be displayed on an alarm display screen and the comment identification information corresponding to this comment when an alarm is output. The alarm display screen is the screen which the display device 5 displays using the alarm function, and the alarm display screen indicates that an abnormality has occurred. When the alarm condition is satisfied, the display device 5 displays the alarm display screen, using the alarm function. On the alarm display screen, the date and time when the abnormality has occurred and the comment for explaining the abnormality are displayed.

The function setting unit 32 sets, in the label function, a device and the label name corresponding to this device. The function setting unit 32 stores in the storage unit 42 the alarm function, the comment function, and the label function, which are provided with various settings. The alarm function, the comment function and the label function are stored in the storage unit 42 as a portion of the project data 424 as will be described later. Specifically, the function setting unit 32 stores the alarm-function information, the comment-function information, and the label-function information in the storage unit 42.

The screen creation unit 33 creates data on the alarm display screen, and data on an abnormal position display screen. The abnormal position display screen is the screen for displaying: an image indicating an abnormality-occurring position; a changing switch; and a lamp indicating an abnormality-occurring position. An image indicating an abnormality-occurring position is, for example, a caption image. The changing switch is a button for changing the position of viewpoint of the external apparatus 7. The screen creation unit 33 creates data on the abnormal position display screen on a display-target-by-display-target basis. The screen creation unit 33 associates the abnormal position display screen with the display target.

The screen creation unit 33 stores the data on the alarm display screen, the data on the abnormal position display screen, the alarm-function information, the comment-function information, and the label-function information in the storage unit 42 as the project data 424.

The display unit 41 displays various types of information such as the image data 422, the list information 423, and the project data 424. Note that, the display unit 41 and the instruction input unit 40 may be configured by a liquid crystal touch panel.

The storage unit 42 stores: the CAD data 421 input from the outside; the image data 422 created by the acquisition unit 20; the list information 423 created by the list-information creation unit 22; and the project data 424 created by the setting unit 30. The project-data output unit. 43, which is connected to the display device 5, outputs the project data 424 stored in the storage unit 42 to the display device 5.

The display device 5 is connected to the alarm-function setting apparatus 10 and the external apparatus 7. The display device 5 has the alarm function, the comment function, and the label function. In other words, the display device 5 stores the alarm display program for implementing the alarm function, the comment specifying program for implementing the comment function, and the label specifying program for implementing the label function. Then, the display device 5 outputs an alarm, using the alarm-function information from the alarm-function setting apparatus 10 and the alarm function. The display device 5 specifies a comment when the alarm is output, using the comment-function information from the alarm-function setting apparatus 10 and the comment function. The display device 5 further specifies a part name when the alarm is output, using the label-function information from the alarm-function setting apparatus 10 and the label function.

The display device 5 performs the alarm function by the processor in the display device 5 executing an alarm function display program. The display device 5 performs the comment function by the processor in the display device 5 executing a comment specifying display program. The display device 5 performs the label function by the processor in the display device 5 executing a label specifying display program.

Figure 2:
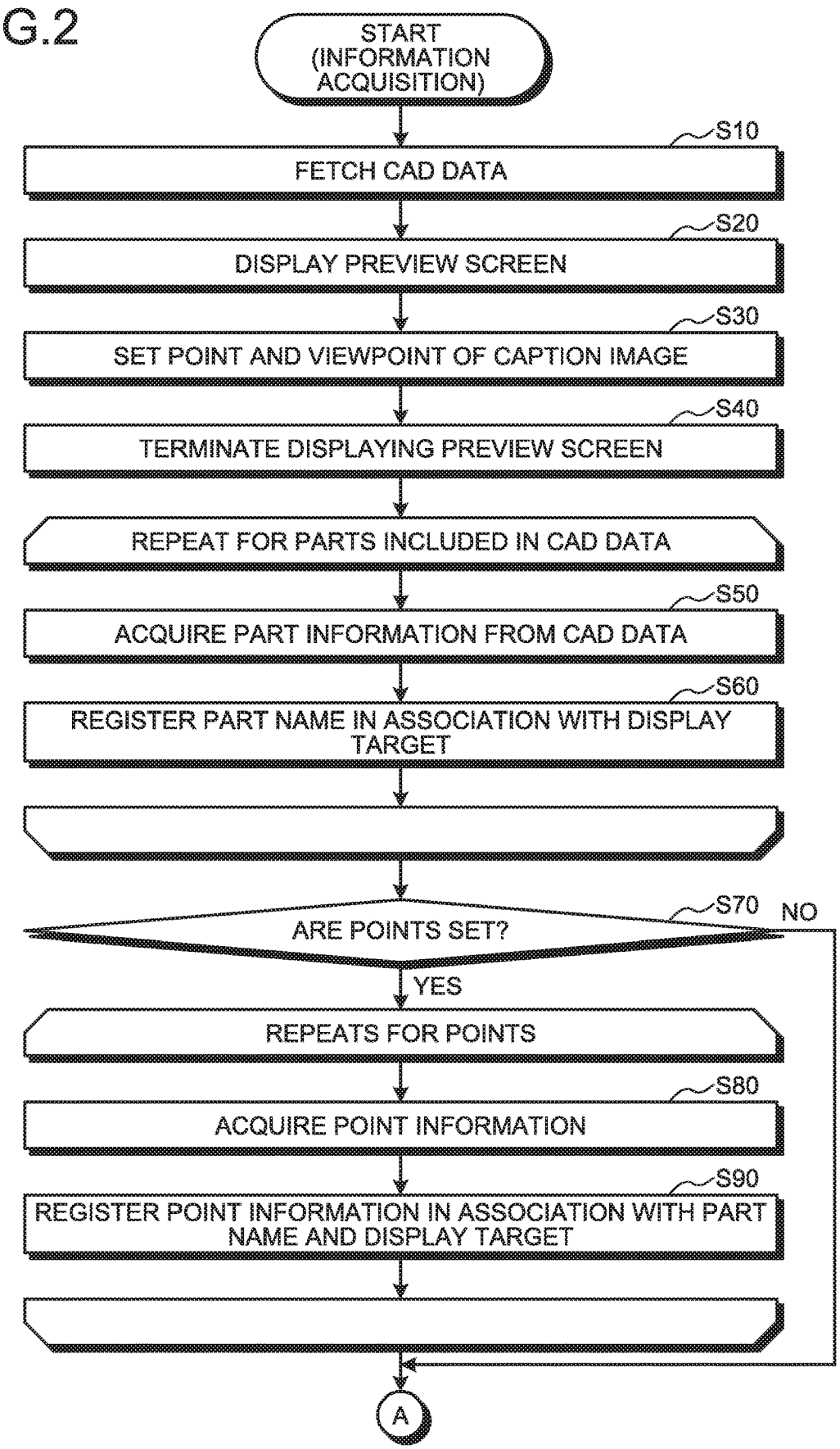
FIG. 2 is a flowchart illustrating a processing procedure of a first half of stages of information acquisition processing according to the embodiment.

Next, information acquisition processing by the alarm-function setting apparatus 10 is described. FIG. 2 is a flowchart illustrating a processing procedure of a first half of stages of information acquisition processing according to the embodiment. FIG. 3 is a flowchart illustrating a processing procedure of a second half of the stages of the information acquisition processing according to the embodiment. The information acquired in the information acquisition processing described with reference to FIGS. 2 and 3 is used for setting the alarm function, the comment function, and the label function.

When starting the information acquisition processing, the alarm-function setting apparatus 10 captures the CAD data 421 from the outside in step S10. Specifically, the data input unit 21 receives the CAD data 421 from the outside and inputs the received CAD data 421 to the storage unit 42. Thus, the CAD data 421 is stored in the storage unit 42.

Then, in step S20, the list-information creation unit 22 displays a preview screen of the external apparatus 7 on the display unit 41, using the CAD data 421 in the storage unit 42. Note that, the list-information creation unit 22 may display a preview screen on the display unit 41 when the operator inputs to the instruction input unit 40 an instruction to display the preview screen. Alternatively, the preview screen may be automatically displayed on the display unit 41 after the CAD data 421 is stored in the storage unit 42.

FIG. 4 is a diagram illustrating examples of CAD data and the preview screen according to the embodiment. The CAD data 421, which is three-dimensional CAD data, indicates the structure of the external apparatus 7. The list-information creation unit 22 can display a preview screen 52 of the external apparatus 7, using the CAD data 421. The list-information creation unit 22 may display any image of a side view, a top view, or a perspective view of the external apparatus 7 as the preview screen 52.

When the operator performs on the instruction input unit 40 the operation for creating the list information. 423 with the display unit 41 displaying the preview screen 52, the instruction input unit 40 receives and transmits the operation to the list-information creation unit 22. The operator performs the operation by, for example, clicking a button displayed on the display unit 41.

When receiving the signal corresponding to the operation from the instruction input unit 40, the list-information creation unit 22 sets a point and a viewpoint of a caption image in step S30. Specifically, when a viewpoint of a caption image is designated by the user operation which is the operation performed by the operator, the list-information creation unit 22 sets the designated viewpoint in the external apparatus 7. When a position of a point is designated, the list-information creation unit 22 further sets the designated position in the external apparatus 7. The point coordinates, which are the position of the point, are coordinates for displaying a lamp when an abnormality occurs. On the basis of the operation by the operator, the list-information creation unit 22 sets one or more viewpoints in a single external apparatus 7 and sets one or more points in a single external apparatus 7.

Figure 5:
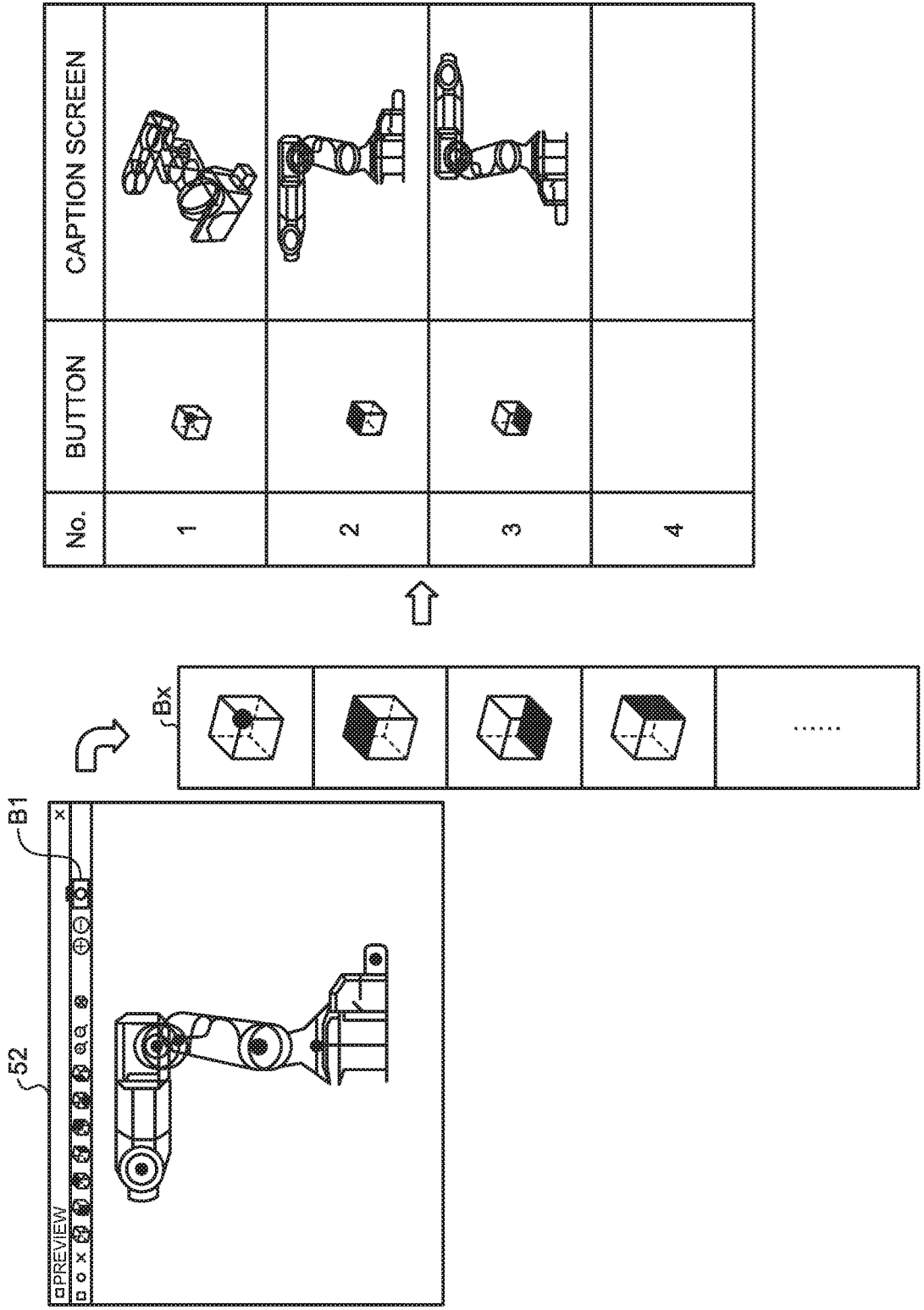
FIG. 5 is a diagram for explaining processing for setting viewpoints of a caption image according to the embodiment.

FIG. 5 is a diagram for explaining processing for setting viewpoints of a caption image according to the embodiment. When a setting button B1 is pressed as the setting operation for setting a viewpoint of a caption image with the display unit 41 displaying the preview screen 52, the list-information creation unit 22 displays a button group Bx on the display unit 41. The button group Bx is buttons for designating a viewpoint of the caption image. The buttons of the button group Bx include, for example, a button for setting the viewpoint on the upper side of the external apparatus 7, a button for setting the viewpoint on the lateral side of the external apparatus 7.

When any one of the button group Bx is pressed with the display unit 41 displaying the button group Bx, the list-information creation unit 22 sets the viewpoint corresponding to the pressed button. The list-information creation unit 22 associates the pressed button with the set viewpoint. Note that, the list-information creation unit 22 may automatically set one or more predetermined viewpoints without receiving designation of a viewpoint from the operator. Although FIG. 5 illustrates the caption screens corresponding to the respective buttons, the caption screens are created in step S120 as will be described later. When any position of the external apparatus 7 is pressed with the display unit 41 displaying the preview screen 52, the list-information creation unit 22 sets the pressed position as the point.

After the setting of the point and the viewpoint of the caption image is completed, the list-information creation unit 22 terminates displaying the preview screen 52 on the display unit 41 in step S40 upon receiving the setting completion operation from the operator via the instruction input unit 40.

Then, the list-information creation unit 22 performs the following processing in steps S50 and S60 for each of the parts included in the CAD data 421. The list-information creation unit 22 extracts the part information from the CAD data 421 in the storage unit 42 to thereby acquire the part information in step S50. The part information includes the part name and the part coordinates.

The list-information creation unit 22 associates the part name with the display target and registers the part name in the list information 423 in step S60. Specifically, the list-information creation unit 22 registers the part name in a location in the list information 423 in which location the name of the part is to be registered. The list-information creation unit 22 further registers the display target corresponding to the part name in a location in the list information 423 in which location the display target is to be registered. The list-information creation unit 22 registers the part coordinates in a location in the list information 423 in which location the part coordinates are to be registered.

When the list-information creation unit 22 sets a point in the external apparatus 7 in step S30, the list-information creation unit 22 registers the point name in the location in the list information 423 in which location the name of the part is to be registered. The list-information creation unit 22 further registers the lamp shape, which is the shape of the point, in a location in the list information 423 in which location the display target is to be registered. This lamp shape is the shape of a lamp that is to be displayed when an abnormality occurs. The point name and the lamp shape registered by the list-information creation unit 22 are a default point name and a default lamp shape, respectively. The list-information creation unit 22 registers different point names for different points, such as point_1 and point_2.

The point name and the lamp shape registered in the list information 423 by the list-information creation unit 22 can be changed by the operation made by the operator. Note that, the list-information creation unit 22 may register the color of the lamp in the list information 423 together with the lamp shape.

After performing the processing in steps S50 and S60 for all the parts included in the CAD data 421, the list-information creation unit 22 determines whether points are set in step S70. When points are set, that is, in the case of Yes in step S70, the list-information creation unit 22 performs the following processing in steps S80 and S90 for each of the set points. The list-information creation unit 22 acquires the point information in step S80. The point information is the point coordinates indicating the position of the point. The list-information creation unit 22 regards the point coordinates designated in step S30, as the point information.

Then, in step S90, the list-information creation unit 22 associates the point information, which is the point coordinates, with the part name and the display target and registers this point information in the list information. 423. After performing the processing in steps S80 and S90 for all the set points, the list-information creation unit 22 completes registering processing of the point information.

On the other hand, when no point is set in step S70, that is, in the case of No in step S70, the list-information creation unit 22 does not perform the registering processing of the point information.

FIG. 6 is a diagram illustrating an example of list information according to the embodiment. The list information 423 is a list of information about the external apparatus 7. In the list information 423, a part name, a device, an alarm condition, a display target, a way to display an error, a comment, and coordinates are associated with one another. A device, an alarm condition, a way to display an error, and a comment are described later.

The part name and the display target in the list information. 423 are the information registered in the list information. 423 by the list-information creation unit 22 in the processing in step S60. When a point is registered in the part name, the coordinates of the point are registered in the list information 423 by the list-information creation unit 22 in the processing in step S90. A device, an alarm condition, a way to display an error, and a comment in the list information 423 are registered by the editing unit 31 in the processing in step S230 as will be described later.

Next, in step S110, the list-information creation unit 22 determines whether the image that is to be displayed is a caption image. When a caption image is set in step S30, the list-information creation unit 22 determines that the image that is to be displayed is a caption image.

When the image that is to be displayed is a caption image, that is, in the case of Yes in step S110, the list-information creation unit 22 performs the following processing in step S120 for each of the set viewpoints. The list-information creation unit 22 creates a caption screen from the CAD data 421 in step S120. At this time, the list-information creation unit 22 creates a caption image of the external apparatus 7 as viewed from the viewpoint set in step S30 and creates a caption screen on which this caption image is placed. The caption screen is a screen on which the caption image of the external apparatus 7 is placed and the caption screen is displayable on the display device 5. When a plurality of viewpoints for the external apparatus 7 is designated in step S30, the list-information creation unit 22 creates a caption screen for each viewpoint. Thus, the list-information creation unit 22 can create caption screens when the external apparatus 7 is viewed from various directions such as a front direction, a rear direction, and a lateral direction.

The list-information creation unit 22 stores the created caption screens in the storage unit 42 as the image data 422. In the image data 422 created by the list-information creation unit 22, the caption screen and the button are associated with each other. The list-information creation unit 22 creates caption screens for all the set viewpoints.

On the other hand, when the image that is to be displayed is not a caption image, that is, in the case of No in step S110, the list-information creation unit 22 acquires three-dimensional CAD image in step S130. Specifically, the list-information creation unit 22 creates three-dimensional CAD image from the CAD data 421 to thereby acquire the three-dimensional CAD image.

The list-information creation unit 22 stores the caption screen or the three-dimensional CAD image in the storage unit 42 as the image data 422. When storing the caption screen or the three-dimensional CAD image in the storage unit 42, the list-information creation unit 22 terminates the information acquisition processing.

Note that, the alarm-function setting apparatus 10 may display the part information and the list information 423 on the display unit 41 in performing the processing in steps S50 and S60. The alarm-function setting apparatus 10 may display the point information and the list information 423 on the display unit 41 in performing the processing in steps S80 and S90. The alarm-function setting apparatus 10 may display the caption screen on the display unit 41 in performing the processing in step S120 or may display the three-dimensional CAD image on the display unit 41 in performing the processing in step S130.

The alarm-function setting apparatus 10 may perform the processing in steps S50 and S60, the processing in steps S70 to S90, and the processing in steps S110 to S130 in any order.

Figure 7:
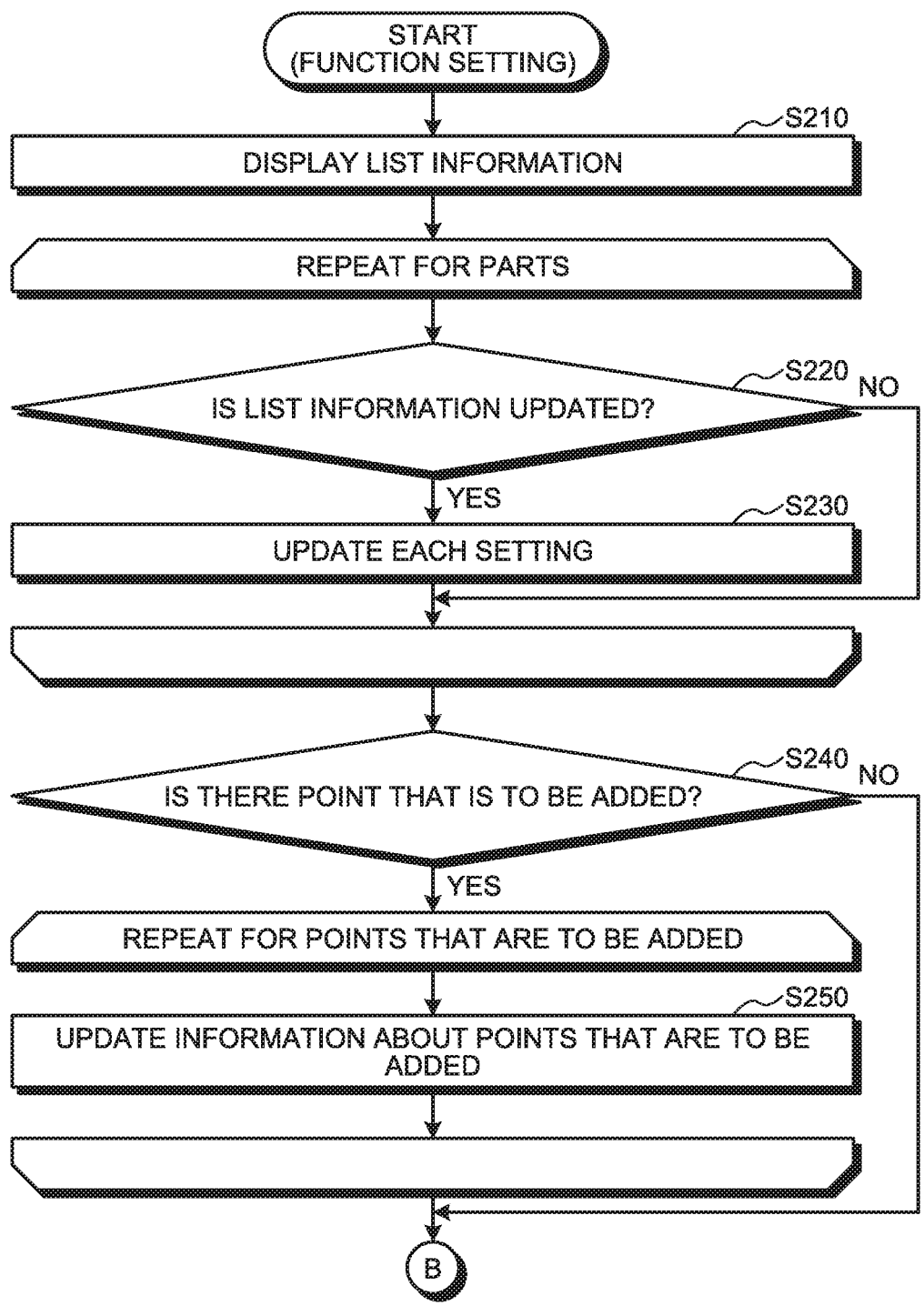
FIG. 7 is a flowchart illustrating a processing procedure of a first half of stages of function setting processing according to the embodiment.
Figure 8:
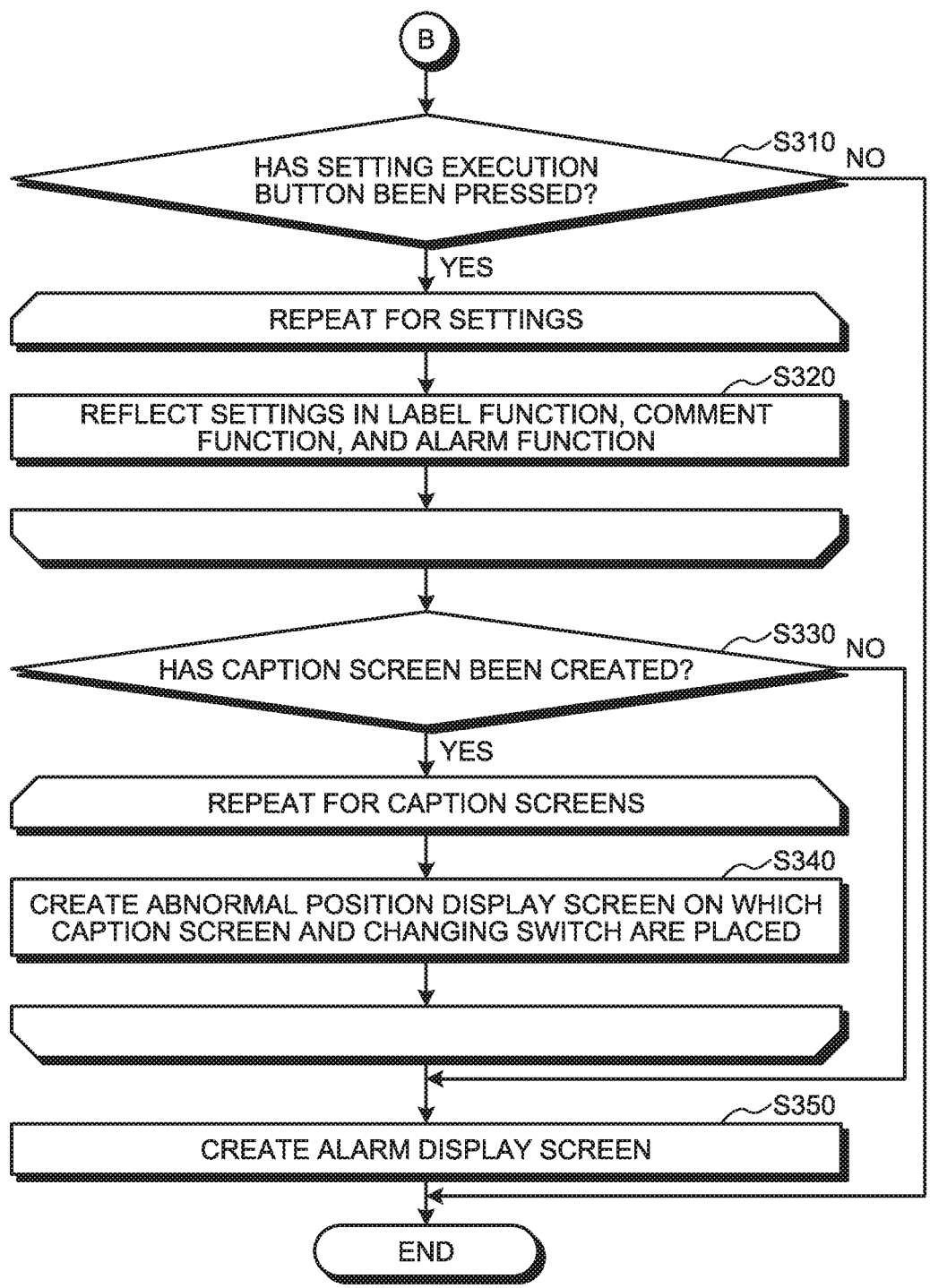
FIG. 8 is a flowchart illustrating a processing procedure of a second half of the stages of function setting processing according to the embodiment.

Next, function setting processing by the alarm-function setting apparatus 10 is described. FIG. 7 is a flowchart illustrating a processing procedure of a first half of stages of function setting processing according to the embodiment. FIG. 8 is a flowchart illustrating a processing procedure of a second half of the stages of the function setting processing according to the embodiment.

When automatically setting a function such as the alarm function, the alarm-function setting apparatus 10 receives editing of the list information 423 from the operator. Specifically, when the operator inputs to the instruction input unit 40 an instruction to edit a function, the instruction input unit 40 transmits the input editing instruction to the editing unit 31. Thus, the editing unit 31 displays the list information 423 on the display unit 41 in step S210.

When the operator performs on the instruction input unit 40 the operation for editing the information relating to a part with the display unit 41 displaying the list information 423, the instruction input unit 40 receives and transmits this editing operation to the editing unit 31.

Then, the editing unit 31 performs the following processing in steps S220 and S230 for each of the parts included in the CAD data 421. In step S220, the editing unit 31 determines whether to update the list information 423. The editing unit 31 determines to update the list information 423 when the operator performs on the instruction input unit 40 the operation for editing the list information 423. When the operation for editing a part included in the list information 423 is performed, that is, in the case of Yes in step S220, the editing unit 31 updates the content of each setting of a part in step S230 that has been subjected to the editing operation.

At this time, the editing unit 31 updates the list information 423 in accordance with the editing operation. When the operator sets a device in the list information 423, the editing unit 31 registers the device in the list information 423. A device indicates an area for storing data input/output to/from the external apparatus 7 which is a control target device connected to the PLC that executes a sequence program. The device is allocated to the address of the internal memory of the PLC. The value of the device is device status information indicating the status of the external apparatus 7. Thus, the device status information indicates the status of the external apparatus 7 such as a sequence control switch or a lighting lamp turned on by a switch. The device status information is also referred to as a device value.

When the operator changes a part name in the list information 423, the editing unit 31 overwrites the pre-change part name in the list information 423 with the changed part name. Since an arbitrary name can be registered in a part name, an arbitrary name can be associated with a device.

When the operator sets a comment in the list information 423, the editing unit 31 registers the comment in the list information 423. A comment registered in the list information 423 is to be displayed on the display device 5 when an abnormality occurs in the external apparatus 7.

When the operator sets an alarm condition in the list information 423, the editing unit 31 registers the alarm condition in the list information 423. An alarm condition is a condition for outputting an alarm to make a notification of occurrence of abnormality. An alarm condition is, for example, an allowable range or an allowable value of the device status information indicated by a device. When an allowable range or an allowable value is set as an alarm condition and when the device status information exceeds the allowable range or the allowable value, the display device 5 outputs an alarm. Alarm output is, for example, display of the alarm display screen.

When the operator sets in the list information 423 a way to display an error, the editing unit 31 registers in the list information 423 the way to display an error. A way to display an error designates how to display on the display device 5 a part or a point which is an abnormality-occurring position when an abnormality occurs in a part of the external apparatus 7. Where "inverting color" is registered as the way to display an error, when an abnormality occurs, the display device 5 inverts the color of the part or the point at which the abnormality has occurred. Inverting color is processing for inverting the color value. Where "blinking" is registered as the way to display an error, when an abnormality occurs, the display device 5 blinks the color of the part or point at which the abnormality has occurred. Note that, the list-information creation unit 22 may automatically register in the list information 423 a default way to display an error.

In this manner, the alarm-function setting apparatus 10 creates the list information 423 by the processing in steps S50, S60, S80, S90, and S230. After editing the list information 423 in the storage unit 42, the editing unit 31 overwrites the pre-editing list information 423 with the edited list information 423.

When the operation for editing the list information 423 is not performed, that is, in the case of No in step S220, the editing unit 31 does not update the list information 423.

When the operator performs on the instruction input unit 40 the operation for editing the information relating to a point with the display unit 41 displaying the list information 423, the instruction input unit 40 receives and transmits the operation to the editing unit 31.

In step S240, on the basis of the operation by the operator, the editing unit 31 determines whether there is a point that is to be added. When the operator adds a point to the list information 423, the editing unit 31 determines to add a point to the list information 423, on the basis of the addition operation of the point.

When there is a point that is to be added, that is, in the case of Yes in step S240, the editing unit 31 performs the following processing in step S250 for each of points that are to be added in step S250, the editing unit 31 updates the information about the points that are to be added. Specifically, when the operator inputs a point name to a part name and the shape of a point to a display target, the editing unit 31 registers the point name in the part name and the shape of the point in the display target. When the operator inputs a way to display an error and the coordinates, the editing unit 31 registers the way to display an error and the coordinates.

Note that, the editing unit 31 may allow the operator to designate a position of a point with the preview screen 52 of the external apparatus 7 being displayed on the display unit 41. In this case, the editing unit 31 registers in the coordinates of the list information 423 the coordinates of the position designated by the operator.

The editing unit 31 adds the point information to the list information 423. On the other hand, if there is no point that is to be added, that is, in the case of No in step S240, the editing unit 31 does not register the point information in the list information 423.

Then, in step S310, the function setting unit 32 determines whether a setting execution button has been pressed on a list-information display screen 53 displaying the list information 423. When the setting execution button is not pressed, that is, in the case of No in step S310, the alarm-function setting apparatus 10 completes the function setting processing. When the operator presses the setting execution button via the instruction input unit 40 with the display unit 41 displaying the list information 423, the instruction input unit 40 receives and transmits this operation to the function setting unit 32.

When the setting execution button is pressed, that is, in the case of Yes in step S310, the function setting unit 32 performs the following processing in step S320 for each of the settings in the list information 423. The number of settings in the list information 423 is the total number of the number of parts and the number of points set in the list information 423. Thus, the function setting unit 32 repeats the following processing in step S320 for the total number of the number of parts and the number of points set in the list information 423.

In step S320, the function setting unit 32 reflects, in the label function, the comment function, and the alarm function, the settings in the list information 423. At this time, the function setting unit 32 registers in the label-function information a correspondence relation between a device and a part name as a label name. Specifically, the function setting unit 32 extracts a device from the list information 423 and extracts the label name corresponding to the extracted device. Then, the function setting unit 32 sets in the label-function information a correspondence relation between the extracted label name and the extracted device. The function setting unit 32 registers in the list information 423 a correspondence relation on a device-by-device basis. Thus, a list of the correspondence relations between label names and devices is registered in the label-function information.

The function setting unit 32 registers, in the comment-function information, a comment registered in the list information 423. The function setting unit 32 associates the comment with the comment identification information and registers the comment in the comment-function information. The comment identification information is identification information set for each comment. Thus, the function setting unit 32 assigns the common comment identification information to the comments identical to one another.

The function setting unit 32 registers, in the alarm-function information, a display target, a device, an alarm condition, and comment identification information in the list information 423. Now, the label-function information set in the label function, the comment-function information set in the comment function, and the alarm-function information set in the alarm function are described.

FIG. 9 is a diagram illustrating a configuration example of label-function information according to the embodiment.

Label-function information 201, which is first correspondence relation information, includes a correspondence relation between a device and a label name that is a registerable arbitrary name such as a part name. FIG. 10 is a diagram illustrating a configuration example of comment-function information according to the embodiment. Comment-function information 202, which is second correspondence relation information, includes a correspondence relation between comment identification information and a comment. FIG. 11 is a diagram illustrating a configuration example of alarm-function information according to the embodiment. Alarm-function information 203 includes a correspondence relation among a device, an alarm condition, and comment identification information. Note that, the alarm-function information 203 may include a display target. In this case, the alarm-function information 203 includes a correspondence relation among a display target, a device, an alarm condition, and comment identification information.

The alarm-function information 203 is used to determine whether an abnormality has occurred in the external apparatus 7 and to determine information that is to be displayed on the alarm display screen. When an abnormality has occurred in the external apparatus 7, the label function uses the label-function information 201 in specifying the part name corresponding to a device in which the abnormality has occurred. The part name specified by the label function is provided for the alarm function. Thus, the alarm function displays the part name on the alarm display screen of the display device 5. When an abnormality has occurred in the external apparatus 7, the comment function uses the comment-function information 202 in specifying the comment corresponding to a display target. The comment specified by the comment function is provided for the alarm function. Thus, the alarm function displays the comment on the alarm display screen of the display device 5.

After the settings in the list information 423 are reflected in the label function, the comment function, and the alarm function, the screen creation unit 33 determines, in step S330, whether a caption screen has been created. Specifically, the screen creation unit 33 determines whether the image data 422 is stored in the storage unit 42.

When the image data 422, which is a caption screen, has been created, that is, in the case of Yes in step S330, the screen creation unit 33 performs the following processing in step S340 for each of caption screens. In step S340, the screen creation unit 33 creates an abnormal position display screen on which a caption screen and the changing switch are placed. The screen creation unit 33 places a caption screen in a partial region of the abnormal position display screen, and places the changing swatch in the remaining region. The changing switch is a switch for switching the viewpoint of the external apparatus 7. The changing switch is, for example, the button illustrated in FIG. 5.

The screen creation unit 33 creates, on a per caption screen basis, an abnormal position display screen on which the changing switch is placed. Thus, when a button, which is the changing switch on the abnormal position display screen displayed on the display device 5, is pressed, the abnormal positional display screen as switched on the basis of the pressed button, such that the caption image is switched to thereby switch the viewpoint of the external apparatus 7. The screen creation unit 33 creates an abnormal position display screen on a per display target basis. Thus, when an abnormality occurs in a first display target, the caption image of the first display target is switched by pressing the changing switch. When an abnormality occurs in a second display target, the caption image of the second display target is switched by pressing the changing switch.

After creating the abnormal position display screens for all the caption screens, the screen creation unit 33 creates an alarm display screen in step S350. Specifically, the screen creation unit 33 creates an alarm display screen including: data defining the configuration of the alarm display screen; data defining information that is to be displayed on the alarm display screen; and data defining the position of placement of the information that is to be displayed on the alarm display screen.

Alarm information that is to be displayed on the alarm display screen is, for example, the date and time of occurrence of abnormality, an abnormality-occurring position, and a comment. The comment is the comment corresponding to a comment identifier set in the alarm function. This comment is registered in the comment-function information 202. The abnormality-occurring position is indicated by the part name corresponding to a device in which the abnormality has occurred. This part name is registered in the label-function information 201. The label-function information 201, the comment-function information 202, the alarm-function information 203, the alarm display screen, and the abnormal position display screen are stored in the storage unit 42 as the project data 424.

Figure 12:
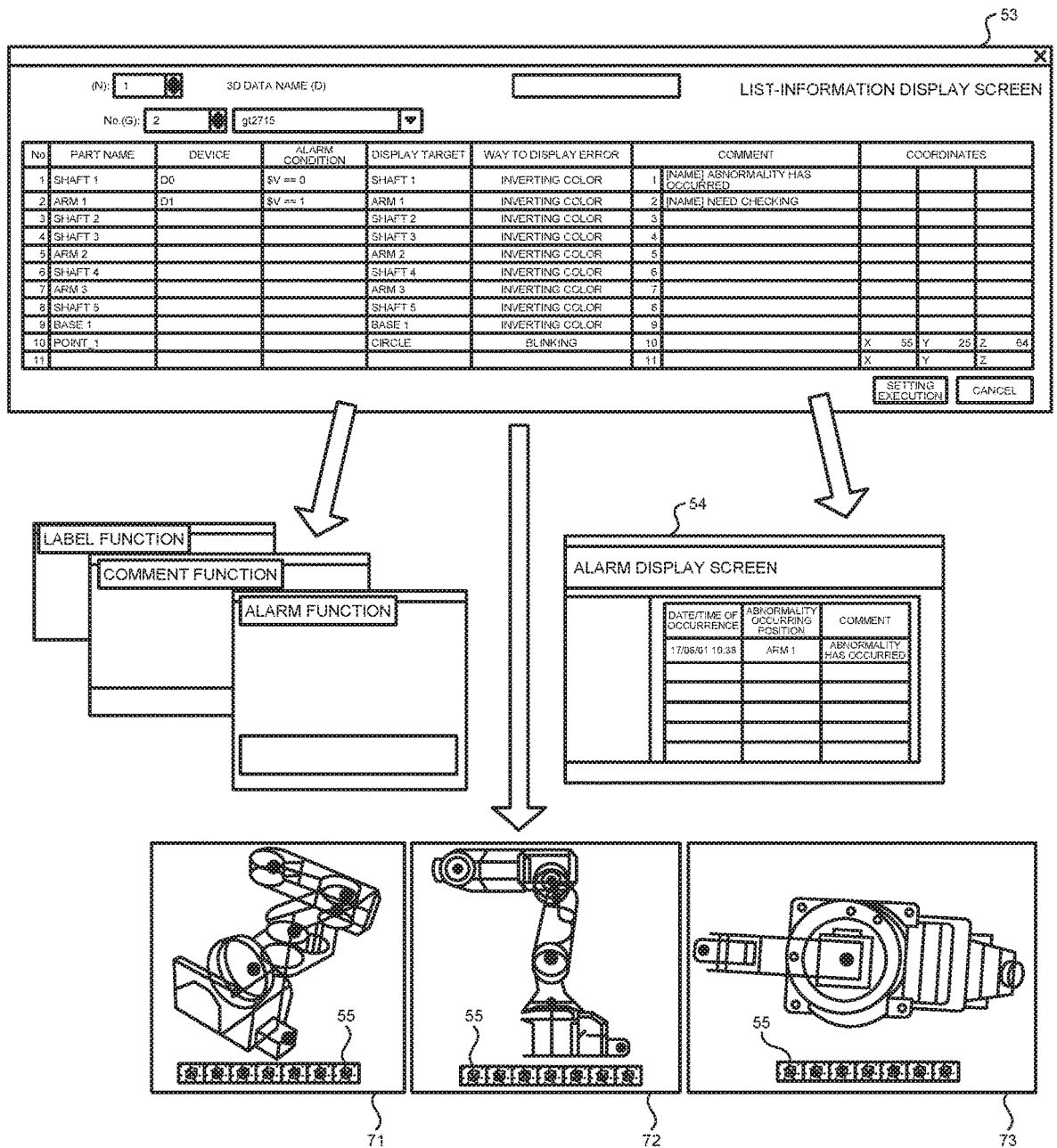
FIG. 12 is a diagram for explaining setting processing by a setting unit according to the embodiment.

Now, setting processing by the setting unit 30 is described. FIG. 12 is a diagram for explaining setting processing by the setting unit according to the embodiment. The editing unit 31 displays the list information 423 on the display unit 41 as the list-information display screen 53. Thus, the operator edits the list information 423, looking at the list-information display screen 53. When editing of the list information 423 is completed, the function setting unit 32 sets the label function, the comment function, and the alarm function, using the list information. 423.

In addition, the screen creation unit 33 creates an alarm display screen 54. The screen creation unit 33 creates abnormal position display screens 71 to 73 each of which has changing switches 55 and the caption screen placed thereon. The abnormal position display screen 71 is a screen showing the external apparatus 7 as viewed from a first viewpoint. The abnormal position display screen 72 is a screen showing the external apparatus 7 as viewed from a second viewpoint. The abnormal position display screen 73 is a screen showing the external apparatus 7 as viewed from a third viewpoint.

The changing switches 55 are placed on the respective abnormal position display screens 71 to 73. Pressing any of the changing switches 55 can change the screen to the corresponding one of the abnormal position display screens 71 to 73. The abnormal position display screens 71 to 73 each display a part or a point which is an abnormal position.

Figure 13:
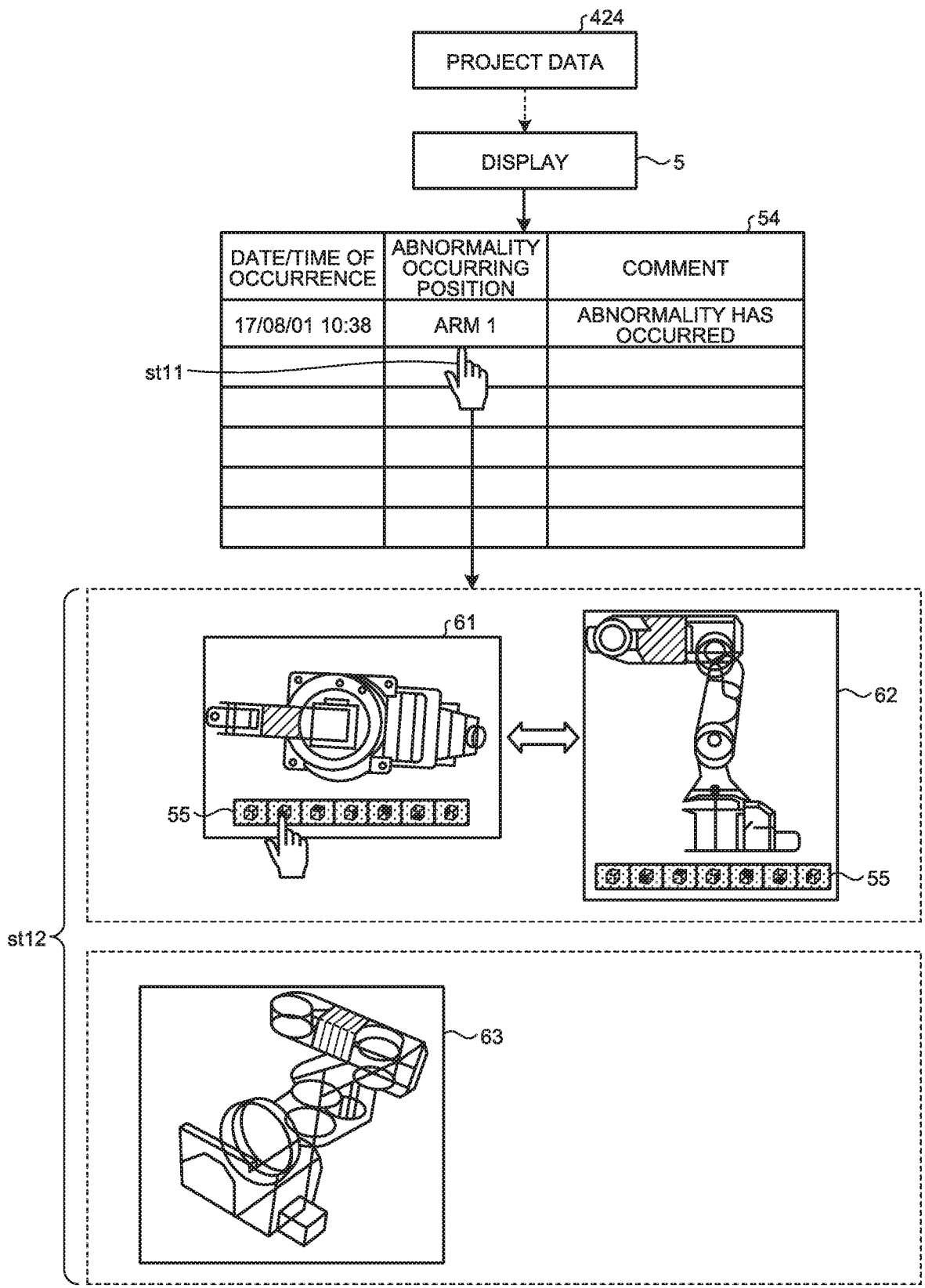
FIG. 13 is a diagram for explaining processing when an alarm function according to the embodiment is used.

Next, processing when the alarm function is used is described. FIG. 13 is a diagram for explaining processing when the alarm function according to the embodiment is used. The alarm-function setting apparatus 10 creates the project data 424 including the alarm-function information 203, the comment-function information 202, the label-function information 201, the alarm display screen 54, and the abnormal position display screen, and transmits the created project data 424 to the display device 5. Thus, the display device 5 operates using the project data 424.

The display device 5 displays the status of the external apparatus 7, such as a sequence control switch or a lighting lamp, as the device status information. The display device 5 changes the device status information in accordance with a change in the status of the external apparatus 7. Thus, the user of the external apparatus 7 can check the status of the external apparatus 7, and thus operate the external apparatus 7 on the basis of the status of the external apparatus 7.

The display device 5 further determines, using the alarm function, whether an abnormality has occurred in the external apparatus 7 during the operation of the external apparatus 7. At this time, on the basis of the device status information and the alarm condition in the alarm-function information 203, the display device 5 determines whether an abnormality has occurred in the external apparatus 7. Then, the display device 5 specifies, by the alarm function, the display target corresponding to the position at which the abnormality has occurred.

In addition, the display device 5 uses the alarm function and the label function to thereby acquire the part name corresponding to the display target and the device. Specifically, in displaying the alarm, the display device 5 performs the alarm function to thereby specify the device which is the abnormal position and the display target corresponding to this device. Then, the display device 5 performs the label function to thereby acquire the part name corresponding to the device.

Further, the display device 5 uses the alarm function and the comment function to thereby acquire the comment corresponding to the abnormality-occurring position. Specifically, in displaying the alarm, the display device 5 performs the alarm function to specify the comment identification information corresponding to the abnormal position. Thus, the display device 5 acquires, by the comment function, the comment corresponding to the comment identification information.

In addition, the display device 5 uses the alarm function to thereby acquire the date and time when the abnormality has occurred from the date and time indicated by a clock. Then, the display device 5 displays the alarm display screen 54 by the alarm function. At this time, the display device 5 displays, by the alarm function, the part name which is the abnormality occurrence position, the date and time of occurrence of the abnormality, and the comment on the alarm display screen 54. The part name displayed on the alarm display screen 54 by the display device 5 is the part name corresponding to the display target in which the abnormality has occurred. The comment displayed on the alarm display screen 54 by the display device 5 is the comment corresponding to the comment identification information corresponding to the display target in which the abnormality has occurred. When an abnormality occurs in the external apparatus 7, as discussed above, the display device 5 displays various types of information indicating the occurrence of abnormality, using the alarm function, the comment function, and the label function.

In addition, when any alarm is selected on the alarm display screen 54 in step st11, the display device 5 displays the abnormal position display screen corresponding to this alarm in step st12. At this time, the display device 5 displays the abnormal position display screen corresponding to the alarm, using the alarm function. Specifically, on the basis of the display target associated with the abnormal position display screen and of the display target in which the abnormality has occurred, the display device 5 extracts the abnormal position display screen highlighting the abnormality-occurring position. Then, the display device 5 displays the extracted abnormal position display screen.

When the abnormal position display screen is created using a caption screen, the display 5 displays, by the alarm function, an abnormal position display screen 61 including a caption screen or an abnormal position display screen 62 including a caption screen. At this time, the display device 5 highlights, by the alarm function, the display target set in the alarm-function information 203, on the abnormal position display screen 61 or the abnormal position display screen 62. Note that although the display device 5 is described as displaying the abnormal position display screen 61 or the abnormal position display screen 62, the display device 5 may da splay, by the alarm function, an abnormal position display screen such as the abnormal position display screens 71 to 73 different from the abnormal position display screen 61 or 62.

When the changing switch 55 is operated on the abnormal position display screen 61 or 62, the display device 5 switches the abnormal position display screen 61 or 62 by the alarm function when the changing switch 55 for switchover to the abnormal position display screen 62 is operated on the abnormal position display screen 61, the display device 5 switches, by the alarm function, the abnormal position display screen from the abnormal position display screen 61 to the abnormal position display screen 62. Alternatively, when the changing switch 55 for switchover to the abnormal position display screen 61 is operated on the abnormal position display screen 62, the display device 5 switches, by the alarm function, the abnormal position display screen from the abnormal position display screen 62 to the abnormal position display screen 61. When the abnormal position display screen is a three-dimensional CAD image, the display device 5 displays, by the alarm function, an abnormal position display screen 63 including a three-dimensional CAD image.

Figure 14:
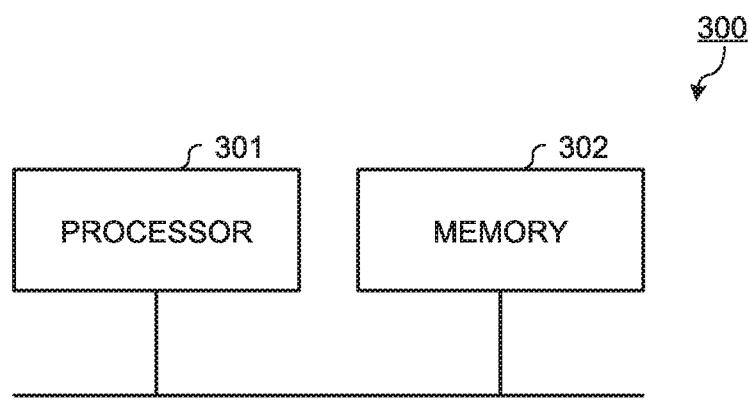
FIG. 14 is a diagram illustrating an example of a hardware configuration of an acquisition unit and a setting unit of the alarm-function setting apparatus according to the embodiment.

A hardware configuration of the acquisition unit 20 and the setting unit 30 of the alarm-function setting apparatus 10 is described. FIG. 14 is a diagram illustrating an example of a hardware configuration of the acquisition unit and the setting unit of the alarm-function setting apparatus according to the embodiment. The acquisition unit 20 and the setting unit 30 can be implemented by a control circuit 300 illustrated in FIG. 14, that is, by a processor 301 and a memory 302. The processor 301 is, for example, a Central Processing Unit (also referred to as a CPU, a processing unit, an arithmetic unit, a microprocessor, a microcomputer, a processor, or a DSP) or a system Large Scale integration (LSI). The memory 302 is, for example, a Random Access Memory (RAM) or a Read Only Memory (ROM).

The acquisition unit 20 and the setting unit 30 are implemented by the processor 301 reading, from the memory 302, and executing an alarm-function setting program for executing the operation of the acquisition unit 20 and the setting unit 30. In other words, the alarm-function setting program is that which causes a computer to execute the procedures or methods of the acquisition unit 20 and the setting unit 30. The memory 302 is also used as a temporary memory when the processor 301 performs various types of processing.

The alarm-function setting program executed by the processor 301 may be implemented by a computer program product which is a recording medium storing the alarm-function setting program therein. The recording medium in this case is, for example, a non-transitory computer readable medium storing the alarm-function setting program therein.

The acquisition unit 20 or the setting unit 30 may be implemented by dedicated hardware. In addition, a part of the function of the acquisition unit 20 or the setting unit 30 may be implemented by dedicated hardware, and another part may be implemented by software or firmware.

Figure 15:
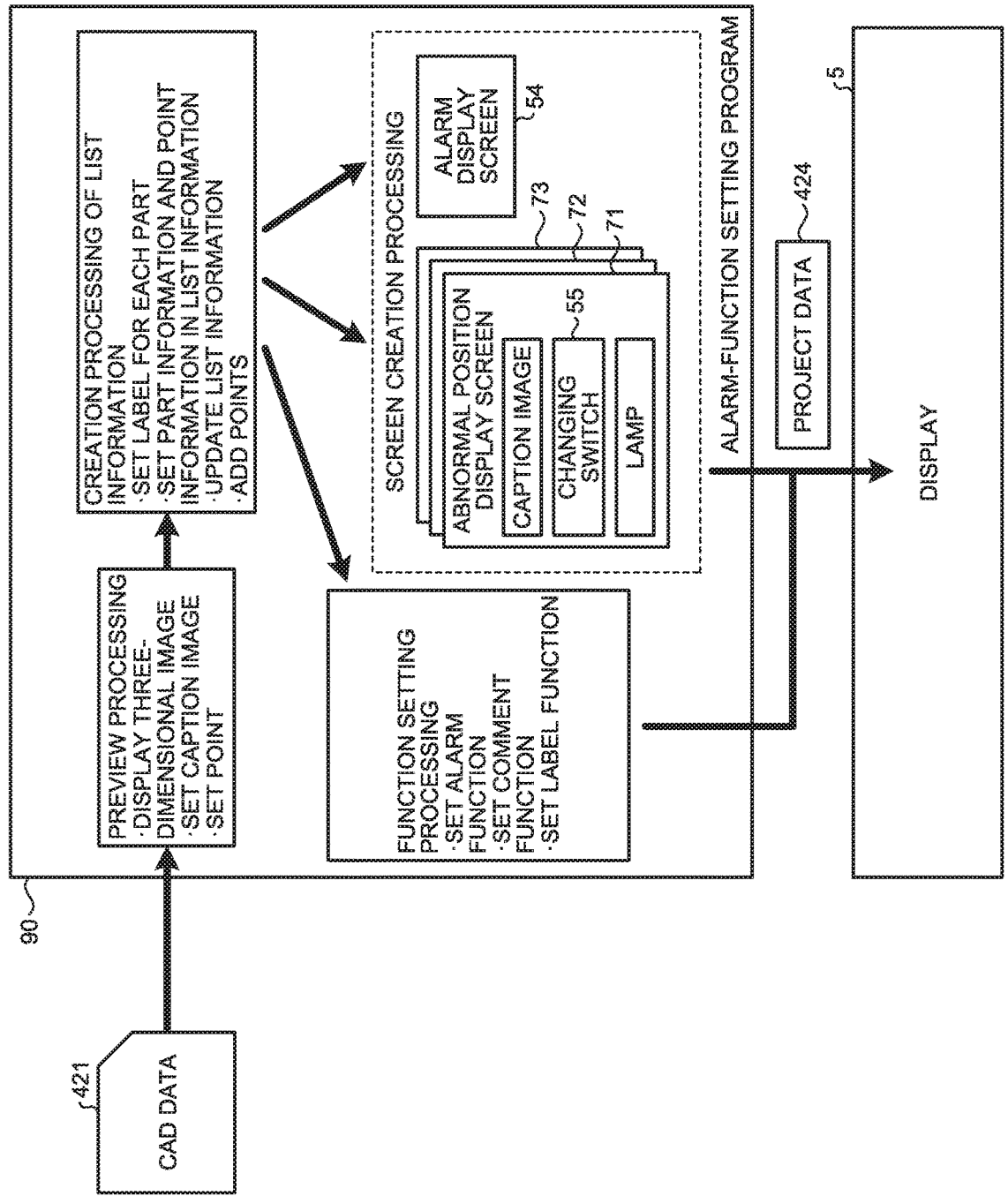
FIG. 15 is a diagram for explaining processing performed by an alarm-function setting program according to the embodiment.

Processing performed by the alarm-function setting program is described. FIG. 15 is a diagram for explaining processing performed by the alarm-function setting program according to the embodiment.

An alarm-function setting program 90 included in drawing software performs preview processing, using the CAD data 421. At this time, the alarm-function setting program 90 displays, using the CAD data 421, a three-dimensional image, which is the preview image of the external apparatus 7, on the display unit 41 when performing the preview processing, the alarm-function setting program 90 performs setting of a caption image based on the operation by the operator and setting of a point based on the operation by the operator. The setting of the caption image is the setting of a viewpoint of the caption image, and the setting of the point is the setting of the point coordinates which is a position of the point.

The alarm-function setting program 90 further performs the processing for creating the list information 423. At this time, the alarm-function setting program. 90 sets the part name on a part-by-part basis. In other words, the alarm-function setting program 90 performs label setting on a part-by-part basis. In creating the list information. 423, the alarm-function setting program 90 sets the part information and the point information in the list information 423. The alarm-function setting program 90 updates the list information. 423 by reflecting various settings in the list information 423 on the basis of the operation by the operator. The alarm-function setting program 90 adds a point to the list information 423 on the basis of the operation by the operator.

The alarm-function setting program 90 further performs the function setting processing, using the list information 423. Specifically, the alarm-function setting program 90 provides various settings for the alarm function, provides various settings for the comment function, and provides various settings for the label function.

The alarm-function setting program 90 further performs screen creation processing, using the list information 423. Specifically, the alarm-function setting program 90 creates an abnormal position display screen such as the abnormal position display screens 71 to 73, using the list information 423. On the abnormal position display screens 71 to 73 created by the alarm-function setting program 90, a caption image, the changing switch 55, and a lamp are placed. The alarm-function setting program 90 creates an alarm display screen such as the alarm display screen 54, using the list information 423.

The alarm-function information 203, the comment function information 202, the label-function information 201, the abnormal position display screens 71 to 73, and the alarm display screen. 54, which are created by the alarm-function setting program 90, are transmitted to the display device 5 as the project data 424. Thus, the display device 5 performs outputting of an alarm and the like, using the project data 424.

As discussed above, the alarm-function setting apparatus 10 automatically registers the part information and the point information in the list information 423, using the CAD data 421 and automatically creates the abnormal position display screens 61 to 63 and 71 to 73, and the alarm display screen 54 from the list information 423. In addition, the alarm-function setting apparatus 10 automatically sets the alarm function, the comment function, and the label function from the list information 423. Thus, it is possible for the operator to create the alarm-function information 203, the comment-function information 202, and the label-function information 201 by reduced operations. Thus, the alarm-function setting apparatus 10 can reduce the engineering man-hours in setting the alarm function, thereby reducing the labors of the operator. For example, since the alarm-function setting apparatus 10 can set the viewpoint of a caption image only by operation of the button group Bx, it is possible to easily create caption images viewed from various viewpoints, provided that the CAD data 421 is read once. On the other hand, if the viewpoint cannot be set by operating the button group Bx, the burden on the operator is increased because it is necessary to read the CAD data 421 multiple times.

As described above, according to the embodiment, on the basis of the CAD data 421, the alarm-function setting apparatus 10 automatically acquires a plurality of caption images of the external apparatus 7 viewed from a plurality of viewpoints and part information about each part of the external apparatus 7, and automatically sets the acquired images and information in the alarm function. AS a result, it is possible to set various types of information in the alarm function in a short time.

The configurations described in the above embodiment are merely examples of the present invention and can be combined with other known techniques, and a part of the configurations can be omitted or changed without departing from the gist of the present invention.

REFERENCE SIGNS LIST 1 alarm-function setting system; 5 display device; 7 external apparatus; 10 alarm-function setting apparatus; 20 acquisition unit; 21 data input unit; 22 list-information creation unit; 30 setting unit; 31 editing unit; 32 function setting unit; 33 screen creation unit; 40 instruction input unit; 41 display unit; 42 storage unit; 43 project-data output unit; 52 preview screen; 53 list-information display screen; 54 alarm display screen; 55 changing switch; 61 to 63, 71 to 73 abnormal position display screen; 90 alarm-function setting program; 201 label-function information; 202 comment-function information; 203 alarm-function information; 421 CAD data; 422 image data; 423 list information; 424 project data; B1 setting button; Bx button group.

The invention claimed is:
1. An alarm-function setting apparatus comprising:
acquisition circuitry configured to capture three-dimensional computer-aided design data of an external apparatus in which occurrence of abnormality is monitored, and acquire part information from the three-dimensional computer-aided design data, the part information being information about a part of the external apparatus; and
setting circuitry to set the part information in an alarm function, the alarm function being a function of, when an abnormality occurs in the external apparatus, conveying information relating to a part at which the abnormality has occurred, the alarm function being used by a display device that displays a status of the external apparatus, wherein
the acquisition circuitry comprises creating circuitry to create image data capable of displaying the external apparatus,
the creating circuitry creates the image data on a basis of the three-dimensional computer-aided design data,
the setting circuitry creates screen data using the image data and sets the screen data in the alarm function,
the setting circuitry determines whether to display a caption image and determines whether to display a three-dimensional computer-aided design image which is created from the three-dimensional computer-aided design data, and the setting circuitry creates, when the caption image is determined to be displayed, a caption screen including the caption image of the external apparatus from the three-dimensional computer-aided design data on a basis of a viewpoint set on the external apparatus, the viewpoint being set by displaying a button group which includes a button representing an upper side of the external apparatus and a button representing a lateral side of the external apparatus.

2. The alarm-function setting apparatus according to claim 1, wherein the setting circuitry creates the caption screen by displaying the button representing the upper side of the external apparatus and the button representing the lateral side of the external apparatus as generic images without an image of the external apparatus.

3. The alarm-function setting apparatus according to claim 2, wherein:
the generic images are of a same generic object with different portions shaded to indicate different viewpoints.

4. The alarm-function setting apparatus according to claim 3, wherein:
the generic images are of the same generic object which is a cube.

5. The alarm-function setting apparatus according to claim 1, wherein
the acquisition circuitry acquires, from the three-dimensional computer-aided design data, a display target part and a first name as the part information, the display target part being a part that is to be displayed by the alarm function on the caption screen as an abnormality-occurring position when an abnormality occurs in the external apparatus, the first name being a name of the display target part, and
the setting circuitry creates first correspondence relation information associating the display target part with the first name and sets, in the alarm function, the display target part in the first correspondence relation information.

6. The alarm-function setting apparatus according to claim 5, wherein
on the basis of a user operation, the acquisition circuitry acquires a display target point and a second name, the display target point being displayed by the alarm function on the caption screen as an abnormality-occurring position when an abnormality occurs in the external apparatus, the second name being a name of the display target point, and
the setting circuitry sets, in the first correspondence relation information, a correspondence relation between the display target point and the second name together with a correspondence relation between the display target part and the first name, the setting circuitry setting, in the alarm function, the display target point in the first correspondence relation information.

7. The alarm-function setting apparatus according to claim 6, wherein the acquisition circuitry captures the three-dimensional computer-aided design data for each part of the external apparatus and acquires the part information from the three-dimensional computer-aided design data on a part-by-part basis.

8. The alarm-function setting apparatus according to claim 5, wherein, on the basis of a user operation, the setting circuitry creates second correspondence relation information associating a comment with identification information about the comment, the comment being displayed by the alarm function on the display device when an abnormality occurs in the external apparatus, the setting circuitry setting the identification information in the alarm function on the basis of the second correspondence relation information.

9. The alarm-function setting apparatus according to claim 8, wherein the acquisition circuitry captures the three-dimensional computer-aided design data for each part of the external apparatus and acquires the part information from the three-dimensional computer-aided design data on a part-by-part basis.

10. The alarm-function setting apparatus according to claim 5, wherein the acquisition circuitry captures the three-dimensional computer-aided design data for each part of the external apparatus and acquires the part information from the three-dimensional computer-aided design data on a part-by-part basis.

11. The alarm-function setting apparatus according to claim 1, wherein, on the basis of a user operation, the setting circuitry creates second correspondence relation information associating a comment with identification information about the comment, the comment being displayed by the alarm function on the display device when an abnormality occurs in the external apparatus, the setting circuitry setting the identification information in the alarm function on the basis of the second correspondence relation information.

12. The alarm-function setting apparatus according to claim 11, wherein the acquisition circuitry captures the three-dimensional computer-aided design data for each part of the external apparatus and acquires the part information from the three-dimensional computer-aided design data on a part-by-part basis.

13. The alarm-function setting apparatus according to claim 1, wherein the acquisition circuitry captures the three-dimensional computer-aided design data for each part of the external apparatus and acquires the part information from the three-dimensional computer-aided design data on a part-by-part basis.

14. The alarm-function setting apparatus according to claim 1, wherein, on the basis of a user operation, the setting circuitry creates second correspondence relation information associating a comment with identification information about the comment, the comment being displayed by the alarm function on the display device when an abnormality occurs in the external apparatus, the setting circuitry setting the identification information in the alarm function on the basis of the second correspondence relation information.

15. The alarm-function setting apparatus according to claim 14, wherein the acquisition circuitry captures the three-dimensional computer-aided design data for each part of the external apparatus and acquires the part information from the three-dimensional computer-aided design data on a part-by-part basis.

16. The alarm-function setting apparatus according to claim 1, wherein the acquisition circuitry captures the three-dimensional computer-aided design data for each part of the external apparatus and acquires the part information from the three-dimensional computer-aided design data on a part-by-part basis.

17. An alarm-function setting system comprising:
a display to display a status of an external apparatus in which occurrence of abnormality is monitored, and use an alarm function to, when an abnormality occurs in the external apparatus, convey information relating to a part at which the abnormality has occurred; and
alarm-function setting circuitry to set, in the alarm function, information used by the alarm function, wherein the alarm-function setting circuitry comprises:

acquisition circuitry to capture three-dimensional computer-aided design data on the external apparatus, and acquire part information from the three-dimensional computer-aided design data, the part information being information about a part of the external apparatus; and setting circuitry to set the part information in the alarm function, wherein the acquisition circuitry comprises creating circuitry to create image data capable of displaying the external apparatus on a viewpoint-by-viewpoint basis, the creating circuitry creates the image data on a basis of the three-dimensional computer-aided design data, the setting circuitry of the alarm-function setting circuitry creates screen data using the image data and sets the screen data in the alarm function, the setting circuitry determines whether to display a caption image and determines whether to display a three-dimensional computer-aided design image which is created from the three-dimensional computer-aided design data, and the setting circuitry creates, when the caption image is determined to be displayed, a caption screen including the caption image of the external apparatus from the three-dimensional computer-aided design data on a basis of a viewpoint set on the external apparatus, the viewpoint being set by displaying a button group which includes a button representing an upper side of the external apparatus and a button representing a lateral side of the external apparatus.

18. The alarm-function setting system according to claim 17, wherein the acquisition circuitry captures the three-dimensional computer-aided design data for each part of the external apparatus and acquires the part information from the three-dimensional computer-aided design data on a part-by-part basis.

19. A non-transitory computer readable medium including an alarm-function setting program which when executed causes a computer to execute:

capturing three-dimensional computer-aided design data on an external apparatus in which occurrence of abnormality is monitored, and acquiring part information from the three-dimensional computer-aided design data, the part information being information about a part of the external apparatus; and setting the part information in an alarm function, the alarm function being a function of, when an abnormality occurs in the external apparatus, conveying information relating to a part at which the abnormality has occurred, the alarm function being used by a display device that displays a status of the external apparatus, wherein the acquiring the part information includes creating image data capable of displaying the external apparatus on a viewpoint-by-viewpoint basis, on a basis of the three-dimensional computer-aided design data, the setting the part information includes creating screen data using the image data; and setting the screen data in the alarm function, the setting the part information determines whether to display a caption image and determines whether to display a three-dimensional computer-aided design image which is created from the three-dimensional computer-aided design data, and the setting the part information includes creating, when the caption image is determined to be displayed, a caption screen including the caption image of the external apparatus from the three-dimensional computer-aided design data on a basis of a viewpoint set on the external apparatus, the viewpoint being set by displaying a button group which includes a button representing an upper side of the external apparatus and a button representing a lateral side of the external apparatus.

20. The non-transitory computer readable medium according to claim 19, wherein acquiring the part information comprises capturing the three-dimensional computer-aided design data for each part of the external apparatus and acquiring the part information from the three-dimensional computer-aided design data on a part-by-part basis.

* * * * *